United States Patent [19]
Eguchi et al.

[11] Patent Number: 5,442,585
[45] Date of Patent: Aug. 15, 1995

[54] DEVICE HAVING DIELECTRIC THIN FILM

[75] Inventors: Kazuhiro Eguchi; Katsuaki Natori, both of Yokohama, Japan

[73] Assignee: Kabushiki Kaisha Toshiba, Kawasaki, Japan

[21] Appl. No.: 86,879

[22] Filed: Jul. 7, 1993

[30] Foreign Application Priority Data

Sep. 11, 1992 [JP] Japan .................................. 4-243792

[51] Int. Cl.6 .............................................. G11C 11/24
[52] U.S. Cl. .................................. 365/149; 365/145; 257/306
[58] Field of Search ............... 257/306, 341, 354, 382, 257/532, 535, 538; 365/145, 149

[56] References Cited

U.S. PATENT DOCUMENTS 5,155,658  10/1992  Inam et al. ........................ 365/145
5,208,479   5/1993  Mathews et al. .................... 257/535

OTHER PUBLICATIONS

Applied Physics Lett. pp. 753–755, 58, 753 (1991) D. K. Chin, et al., Feb. 18, 1991.
Japanese Journal of Applied Physics pp. 2210–2212, 28, L22109 (1989); Haruhiro Hasegawa, et al., Dec., 1989.
Japanese Journal of Applied Physics pp. 4976–4981, 70, 4976 (1991); Yoshida et al.; Nov. 1, 1991.

*Primary Examiner*—David C. Nelms
*Assistant Examiner*—F. Niranjan
*Attorney, Agent, or Firm*—Oblon, Spivak, McClelland, Maier & Neustadt

[57] ABSTRACT

According to the present invention, there is provided a device having dielectric thin film comprising an impurity-containing first electrode having a perovskite-type crystal structure and made of the first dielectric material, a dielectric thin film made of the second dielectric material epitaxially deposited on the surface of the first electrode, and the second electrode provided on the surface of the dielectric thin film.

20 Claims, 5 Drawing Sheets

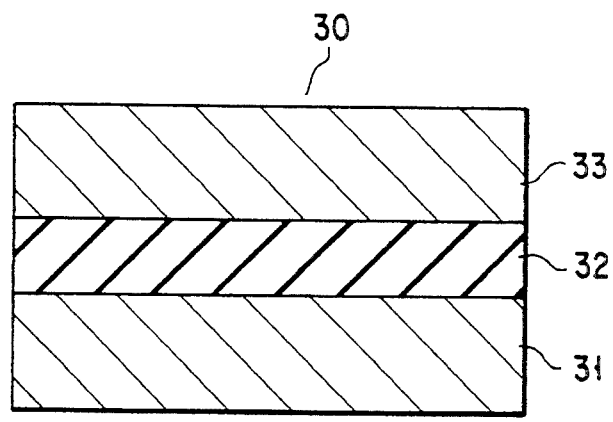
F I G. 5
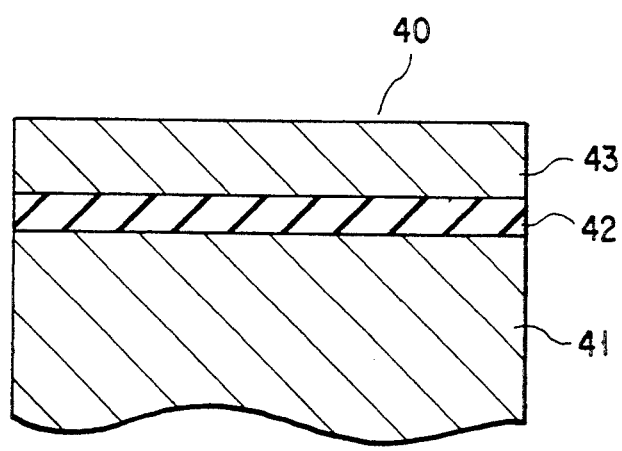
F I G. 6
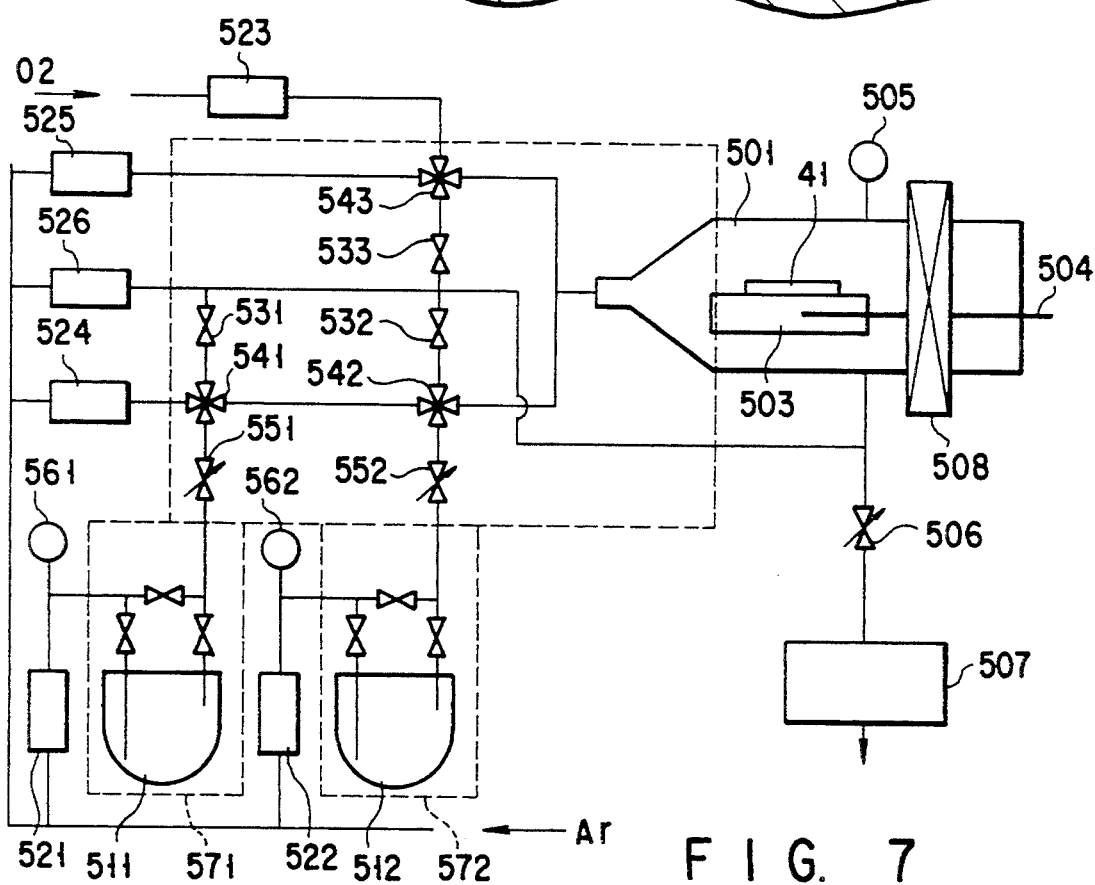
F I G. 7

DEVICE HAVING DIELECTRIC THIN FILM

BACKGROUND OF THE INVENTION

1. Field of the Invention

The present invention relates to a device having a high-quality dielectric thin film, and more specifically, to a thin film capacitor which can be highly integrated, an ultrasonic-wave/electric-signal transducer capable of handling ultrasonic waves of megahertz order or higher, or an optical device having excellent characteristics.

2. Description of the Related Art

Dielectric materials such as lead zirconate titanate (PZT: $PbZr_{1-x}Ti_xO_3$), and strontium titanate ($SrTiO_3$), are shaped into thin films, and used as various types of device.

PZT, in particular, is known as a typical ferroelectric material, and PZT thin films are formed on various types of substrates to manufacture ferroelectric device. In practice, MgO singlecrystalline type, silicon singlecrystalline type, and platinum type substrates are generally used. As for making thin films, physical vapor deposition (PVD) methods such as sol-gel, sputtering, vapor deposition, and laser abrasion methods, or chemical vapor deposition (CVD) methods are used. However, PZT thin films prepared by these methods are mostly of the non-orientational, or polycrystalline type. With the conventional methods, singlecrystalline thin films without defects have not been manufactured.

It is known that a singlecrystalline PZT thin film contributes to improvement of the dielectricity and remanence, and reduction of the leak current. In other words, with a PZT singlecrystalline thin film, the characteristics of various types of ferroelectric devices can be improved.

A specific example of the dielectric device is a thin film capacitor, and the performance of this device greatly depends upon the characteristics of the dielectric thin film.

However, a conventional thin film capacitor entails a drawback, namely, a large leak current due to deterioration of the characteristics of dielectric thin films located close to an electrode. Further, in order to increase the capacitance of a capacitor, the thickness of a dielectric thin film used for the capacitor is reduced; however, if the film is made too thin, the performance of the capacitor deteriorates.

The performance of a capacitor, which so much depends on the characteristics of the dielectric thin film, is an important factor of a memory cell such as DRAM. A conventional DRAM capacitor, which has a structure in which a dielectric film made of silicon oxide ($SiO_2$), silicon nitride ($Si_3N_4$), or the like, is formed on a lower electrode, is not still a satisfactory product in terms of degree of integration, capacitance, etc.

Lately, the above-described PZT has been proposed as a dielectric material in place of silicon oxide, or the like. Further, tantalic oxide ($Ta_2O_5$), strontium titanate ($SrTiO_3$), and barium titanate ($BaTiO_3$) are dielectric materials which exhibit characteristics similar to those of PZT, and can be used as dielectric thin films of capacitors. However, with any of the conventional film thinning methods, dielectric thin films having excellent characteristics have not been obtained from the above-mentioned dielectric substances. Such a trial raises a drawback similar to the case of the thin film capacitor, more specifically, even if the thickness of the dielectric thin film is reduced, a charge capacitance large enough and leak current low enough to be used as a capacitor of a DRAM cannot be achieved.

As described above, the performance of a device having a dielectric thin film can be improved by upgrading the characteristics of the dielectric thin film. However, such a high performance device has not yet been achieved.

SUMMARY OF THE INVENTION

The purpose of the invention is to provide a device having a high-quality dielectric thin film.

According to the present invention, there is provided a device having a dielectric thin film, comprising: a first electrode made of a first dielectric material containing an impurity; a dielectric thin film made of a second dielectric material, and provided on a surface of the first electrode; and a second electrode provided on a surface of the dielectric thin film.

There is also provided according to the present invention, a device having a dielectric thin film, comprising: a first electrode made of a first dielectric material having a perovskite-type crystal structure, and containing an impurity; a dielectric thin film made of a second dielectric material, and provided on a surface of the first electrode; and a second electrode provided on a surface of the dielectric thin film.

There is further provided an optical device having a dielectric thin film, comprising: a substrate having a perovskite-type crystal structure, and a waveguide made of an oxide ferroelectric singlecrystalline thin film formed on the substrate by epitaxial deposition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a diagram showing a cross section of a transducer according to another embodiment of the present invention;

FIG. 6 is a diagram showing a device cross section of a thin film capacitor according to another embodiment of the present invention;

FIG. 7 is a diagram showing a brief structure of an MOCVD apparatus used in another embodiment of the present invention;

DETAILED DESCRIPTION OF THE PREFERRED EMBODIMENTS

The first embodiment of the present invention is directed to a device comprising the first electrode made of the first dielectric material containing an impurity, a dielectric thin film made of the second dielectric material, and the second electrode.

Conventionally, the first electrode of the thin film capacitor is usually made of a metal, whereas in the present invention, a dielectric material to which an impurity was added to make electrically conductive is used as the first electrode.

The material for the first dielectric thin film, which serves as a substrate, is selected on the basis of the characteristics of the second dielectric thin film which is desired. For example, in order to form a high quality ferroelectric singlecrystalline thin film on a substrate, it is preferable that certain characteristics of the substrate and the dielectric material be close to each other. Examples of the characteristics which should be close to each other are the lattice constant, crystal structure, constitutional element, thermal property.

Examples of the impurity added to the dielectric material are niobium, vanadium, and tantalum, and the preferable amount of the impurity should be usually 0.01 to 1 by weight %. A substrate containing an impurity in amount of the mentioned range should have a resistivity of about 0.1 to 10 m$\Omega$·cm. For example, a strontium titanate substrate having an impurity, niobium in amount of about 0.3 by wt %, would have a resistivity of about 3 m$\Omega$·cm, and could fully serve as an electrode.

The material for the second dielectric may be selected on the basis of usage of the product device. For example, the second dielectric material may be a compound which is represented by a formula $ABO_3$ (wherein A is at least one metal selected from the group consisting of Pb, Ca, Sr, Ba, and La, B is at least one metal selected from the group consisting of Ti and Zr).

In the present invention, a device is formed by providing the second electrode on the above second dielectric.

Platinum or the like can be used as the second electrode. A device having such a structure can be applied to a thin film capacitor, ultrasonic wave—electrical signal transducer, and the like.

Formation of a PZT singlecrystalline thin film as the second dielectric material will now be described in detail. Here, it is preferable that a compound having a perovskite-type crystal structure is used as a substrate.

Figure 1:
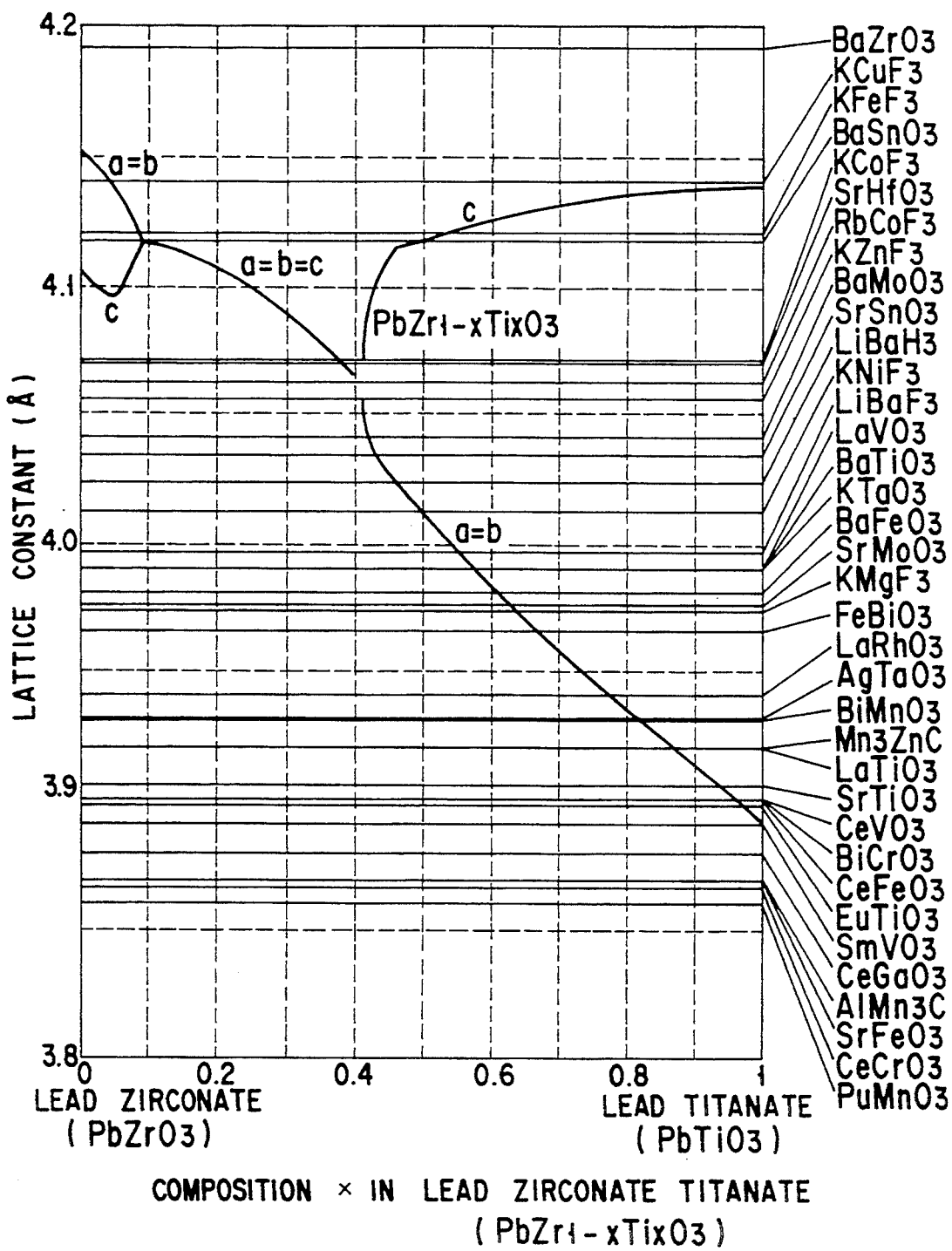
FIG. 1 is a diagram showing the relationship between a Ti composition, x in a PZT ($PbZr_{1-x}Ti_xO_3$) crystal, and a lattice constant.

FIG. 1 shows the relationship between a Ti composition x in ($PbZr_{1-x}Ti_xO_3$: PZT) and a lattice constant. On the right hand side area of the vertical axis, shown are compounds each having a lattice constant close to that of the above-mentioned PZT.

As shown in FIG. 1, examples of the perovskite-type crystals which can have a lattice constant about the same as that of PZT by changing the coefficient thereof, are $BaZrO_3$, $KCuF_3$, $KFeF_3$, $BaSnO_3$, $KCoF_3$, $SrHfO_3$, $RbCoF_3$, $KZnF_3$, $BaMoO_3$, $SrSnO_3$, $LiBaH_3$, $KNiF_3$, $LiBaF_3$, $LaVO_3$, $BaTiO_3$, $KTaO_3$, $BaFeO_3$, $SrMoO_3$, $KMgF_3$, $FeBiO_3$, $LaRhO_3$, $AgTaO_3$, $BiMnO_3$, $Mn_3ZnC$, $LaTiO_3$, $SrTiO_3$, $CeVO_3$, $BiCrO_3$, $CeFeO_3$, $EuTiO_3$, $SmVO_3$, $CeGaO_3$, $AlMn_3C$, $SrFeO_3$, $CeCrO_3$, and $PuMnO_3$. On each of these singlecrystalline substrates having a perovskite-type crystal structure, a PZT singlecrystal having a lattice constant about the same as that of the corresponding substrate can be formed by epitaxial deposition.

Correlations between substrates and Ti composition x of PZT which can be formed by epitaxial deposition will be summarized as follows:

| Substrate | Ti composition x |
| --- | --- |
| $BaZrO_3$ | $x = 0$ |
| $KCuF_3$ | $0 \leq x \leq 0.2$ |
| $KFeF_3$, $BaSnO_3$ | $0 \leq x \leq 0.33$ |
| $KCoF_3$, $SrHfO_3$ | $0.16 \leq x \leq 0.43$ |
| $RbCoF_3$ | $0.24 \leq x \leq 0.44$ |
| $KZnF_3$ | $0.24 \leq x \leq 0.51$ |
| $BaMoO_3$ | $0.33 \leq x \leq 0.53$ |
| $SrSnO_3$ | $0.4 \leq x \leq 0.57$ |
| $LiBaH_3$ | $0.41 \leq x \leq 0.62$ |
| $KNiF_3$ | $0.41 \leq x \leq 0.66$ |
| $LiBaF_3$ | $0.43 \leq x \leq 0.68$ |
| $LaVO_3$, $BaTiO_3$, $KTaO_3$ | $0.43 \leq x \leq 0.73$ |
| $BaFeO_3$ | $0.44 \leq x \leq 0.77$ |
| $SrMoO_3$ | $0.51 \leq x \leq 0.77$ |
| $KMgF_3$ | $0.51 \leq x \leq 0.82$ |
| $FeBiO_3$ | $0.53 \leq x \leq 0.82$ |
| $LaRhO_3$ | $0.62 \leq x \leq 0.93$ |
| $AgTaO_3$, $BiMnO_3$ | $0.66 \leq x \leq 1$ |
| $Mn_3ZnC$, $LaTiO_3$ | $0.68 \leq x \leq 1$ |
| $SrTiO_3$, $CeVO_3$ | $0.77 \leq x \leq 1$ |
| $BiCrO_3$, $CeFeO_3$, $EuTiO_3$ | $0.77 \leq x \leq 1$ |
| $SmVO_3$ | $0.82 \leq x \leq 1$ |
| $CeGaO_3$ | $0.85 \leq x \leq 1$ |
| $AlMn_3C$, $SrFeO_3$, $CeCrO_3$ | $0.88 \leq x \leq 1$ |
| $PuMnO_3$ | $0.93 \leq x \leq 1$ |

The value of the composition x can be varied by adjusting the flow rate of the carrier gas supplied to the source gas container.

The second embodiment of the invention is directed to a device including a substrate having a perovskite-type crystal structure and an oxide ferroelectric singlecrystal thin film formed on the substrate.

As the substrate having a perovskite-type crystal structure, the compounds listed along the vertical axis of FIG. 1 can be used, and as the oxide ferroelectric material, PZT, barium titanate, and the like can be used. As in the case of the first embodiment, the ferroelectric thin film can be formed by the MOCVD method.

Since the ferroelectric thin film prepared as described above has enhanced optical characteristics such as transmittivity, nonlinear electrooptic constant, and electrooptic coupling constant compared to the case of the polycrystalline type, the thin film can be applied to an optical device including waveguides.

The dielectric thin film of the invention should preferably be of the singlecrystalline type; however may contain some polycrystals or dislocations, if not a complete singlecrystal. More specifically, the dislocation density, expressed by the number of etch pits per unit area, should be $10^8/cm^2$ or less, with $10^5/cm^2$ or less being more preferable.

Dielectric thin films can be formed by a physical vapor deposition method such as sputtering, or chemical vapor deposition method. In the present invention, the Metalorganic Chemical Vapor Deposition method is used.

Figure 2:
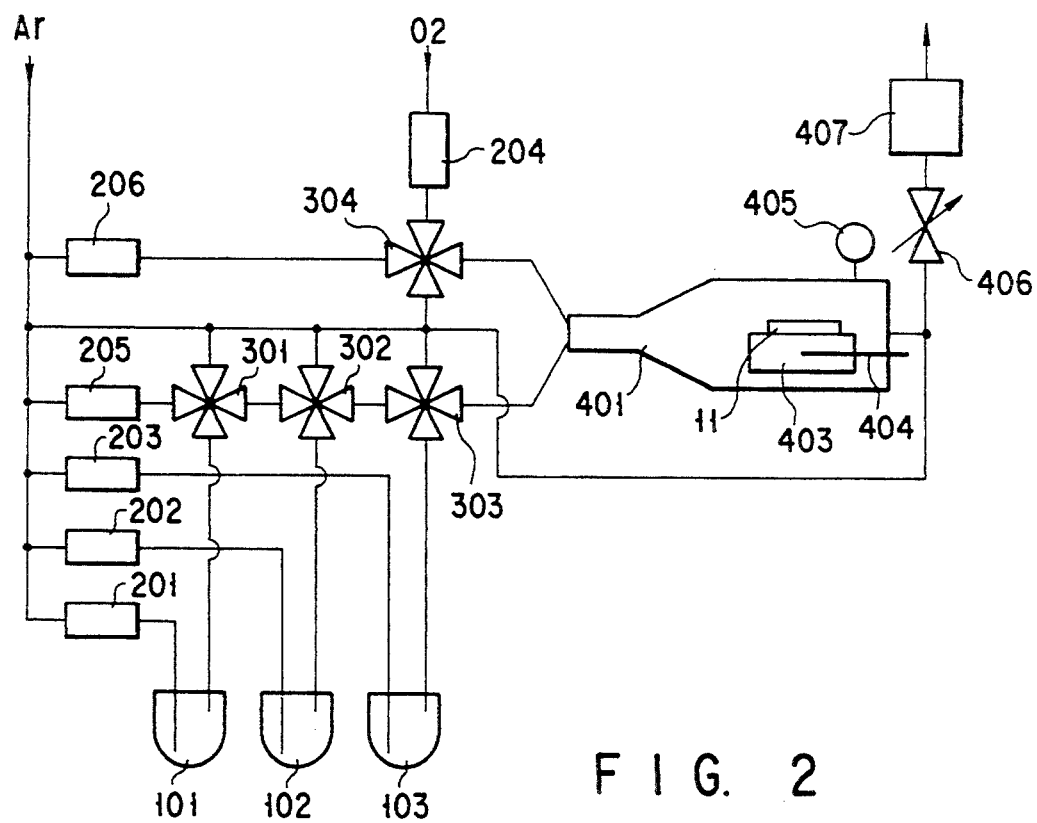
FIG. 2 is a diagram showing a brief structure of an MOCVD apparatus for manufacturing a device of the present invention.

The method of forming a PZT singlecrystalline thin film by the epitaxial deposition will now be described. FIG. 2 shows an MOCVD apparatus used in the method.

As shown in the figure, a substrate 11 is placed on a resistive heater 403 provided in a quartz-made reactor 401. Then, a carrier gas is made to flow into the reactor 401 so as to replace the air in the container 401 with the gas. Next, a rotary pump 407 is driven to adjust the pressure in the reactor 401 to a predetermined value while monitoring a gauge 405.

With operating the gas switching valve 304, an oxygen gas is introduced into the reactor 401 along with the carrier gas. The flow rate of the oxygen gas is controlled by a mass flow controller 204. Further, the substrate 11 is heated by the heater 403 up to a predetermined temperature, and the surface of the substrate is cleaned by the oxygen gas.

In the meantime, source gases, or lead, zirconium, and titanium sealed in stainless steel-made source gas containers 101, 102, and 103, respectively, are heated up to a predetermined temperature by a heating oven (not shown), with the temperature maintained thereby. These source gases are fed into the reactor 401 by supplying the carrier gas into the containers 101-103. The flow rate of the carrier gas is controlled by the mass flow controllers 201-203, each of which controls the flow rate of the source gas supplied into the reactor 401. The carrier gas is introduced into the reactor 401 via the mass flow controllers 205 and 206 while maintaining the flow rate of the source gas at a constant rate.

Before actual formation of a thin film, the following pre-steps are carried out. That is, with switching the gas switching valves 301-303 to the exhaustion side, the carrier gas is supplied into the source gas containers 101-103. After the temperature and pressure in the reactor 401 stabilize to the predetermined values, the gas switching valves 301-303 are switched from the exhaustion side to the reactor side so as to introduce the source gas into the reactor 401. During the deposition of the thin film, the temperature of the substrate 11, and the pressure in the reactor 401 are maintained constant by means of a thermocouple 404, and a conductance adjusting valve 406.

All of the flow path switching valves 301-304 are of the air operation type, and the electromagnetic valve provided on the air supply path of each of the valves is controlled remotely by a computer-operated sequence control apparatus. It should be noted that all the piping between the source containers and the reactor is housed in the oven (not shown), and is maintained at a temperature higher than that of the source containers actually used.

After a certain deposition time, the reactor side of each of the flow path switching valves 301-303 is changed to the exhaustion side so as to stop the introduction of the source gas. Then, the heating of the substrate by the heater 403 is stopped to cool the substrate 11.

The sources of supply of lead, zirconium, and titanium are, for example, tetraethyllead ($Pb(C_2H_5)_4$), tetratertiarybutoxidezirconium ($Zr(t-OC_2H_5)_4$), and tetraisopropoxidetitanium ($Ti(i-OC_3H_7)_4$), respectively. In addition, alkoxide compounds of Ti and Pb, alkyl compounds of the same, $\beta$ ketone complex compounds of the same, alkylamine compounds of the same can be used.

The source of oxygen are, for example, oxygen ($O_2$), dinitrogen monoxide ($N_2O$), nitrogen dioxide ($NO_2$), nitrogen monoxide (NO), ozone ($O_3$), furan ($C_4H_4O$), and tetrahydrofuran ($C_4H_8O$).

High-purity Ar, $N_2$, He, or the like can be used as a carrier gas.

The PZT thin film is formed on the substrate 11 in the above steps.

It should be noted that various dielectric thin films can be formed on a substrate by changing the type of the source gas.

Experimental Example

A PZT thin film was formed on a (100) strontium titanate singlecrystalline substrate by use of the apparatus shown in FIG. 2, and the characteristics of the thin film obtained were examined.

A strontium titanate singlecrystalline substrate 11, the surface of which was already cleaned by chemical etching, was placed on a resistive heater 403 in a reactor 401, and the air in the reactor was replaced with a carrier gas. As the carrier gas, high-purity Ar was used. Then, a rotary pump 407 was driven so as to set the pressure in the reactor 401 at 10 Torr while monitoring a manometer 405.

In source gas containers 101, 102 and 103, tetraethyllead, tetratertiarybutoxidezirconium, and tetraisopropoxidetitanium were sealed in advance, and the source gases were maintained at 20° C., 70° C., and 70° C., respectively.

A high-purity oxygen gas was supplied into the reactor 401 via a mass flow controller 204, and the singlecrystalline substrate 11 was heated by the resistive heater 403 up to 850° C., so as to clean the surface of the singlecrystalline substrate 11. During the surface cleaning, the following preliminary gas-flow steps were carried out. That is, with the reactor side of each of the flow path switching valves 301-303 closed, the carrier gas was supplied into the source gas containers 101, 102, and 103. The flow rate of the Ar gas supplied to each of the source gas container 101, 102, and 103 was adjusted by the mass flow controllers 201, 202, and 203, respectively, at rates of 10SCCM, 30SCCM, and 5SCCM.

After the temperature of the substrate, and the pressure in the reactor stabilized at 600° C. and 10 Torr, respectively, the reactor side of each of the switching valves 301-303 was opened, and the exhaustion side of each of the valves was closed so as to introduce the source gas into the reactor 401. Thus, the deposition of the PZT singlecrystalline thin film was started. After one hour of deposition, the introduction of the source gases was stopped, and the heating of the substrate by the heater 403 was stopped. Then, the substrate was cooled, and during the cooling, the oxygen gas was let flow.

Figure 3:
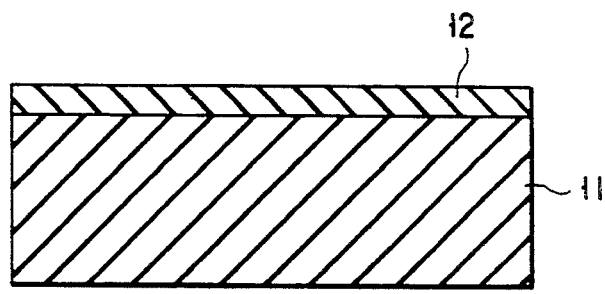
FIG. 3 is a diagram showing a cross section of a PZT thin film substrate prepared by the apparatus shown in FIG. 2.

FIG. 3 shows a cross section of a dielectric substrate having a PZT crystal thin film, prepared after the above-described steps. As shown, about 0.3 μm-thick PZT singlecrystalline thin film 12 is formed on an strontium titanate singlecrystalline substrate 11.

Various analysis and observations were carried out on the dielectric substrate having the dielectric thin film.

According to the analysis by the inductively coupled plasma spectroscopy (ICP method), it was found that the composition of the PZT singlecrystalline thin film had a Ti composition x=0.94, and Pb/(Zr+Ti)=1. According to the observation of the surface of the PZT thin film by a differential interference microscope, it was found that the irregularity of the surface was as small as about 1 nm (very flat), and no defects due to lattice mismatching were observed.

According to the results of the X-ray diffraction analysis, it was found that only diffraction peaks from (00m) plane of PZT and (00m) plane of strontium titanate are observed, indicating that c plane of PZT runs in parallel to c plane of strontium titanate, which is called "c-axis orientation".

According to the measurement of the rocking curve at (002) peak of PZT by four crystal X-ray diffractometer the fullwidth at half maximum (FWHM) of (002) was about 1000 seconds. Further, from the results of the electron beam diffraction measurement, it was found that the directions of a-, and b-axes of PZT are parallel to those of a-, and b-axes of strontium titanate serving as a substrate. This is an indication that the PZT thin film was optically deposited on the strontium titanate substrate.

Thin films were formed on a strontium titanate singlecrystalline substrate having (001) orientation with various values for the Ti composition x of PZT for finding appropriate values of x for epitaxial deposition. It was found that the epitaxial deposition occurs within a range of $0.75 \leq X \leq 1$. The variation of the composition x was controlled by adjusting the flow rate of the carrier gas introduced into the source containers of Zr and Ti.

In the case where PZT thin films were formed on a (001) strontium titanate singlecrystalline substrate under a condition similar to that of the above, thin films could be formed by the epitaxial deposition although numerous lines due to defects were observed on the surfaces of the thin films. The rocking curve of the thin film was measured by the four crystals X-ray diffractometer, and the results indicated that the full-width at half maximum (FWHM) of (002) peak was about 3000 seconds. Further, PZT thin films were formed under the same condition except that the deposition temperature was varied, and it was further found that PZT thin films were formed by the epitaxial deposition in a range of 450° C.-800° C.

Singlecrystalline PZT thin films could be formed by the epitaxial deposition on (110) and (111) strontium titanate singlecrystalline substrates.

From the results of the experimental example, it is concluded that a PZT singlecrystalline thin film can be deposited by use of a perovskite-type singlecrystalline substrate. Particularly in the case where a (100) strontium titanate singlecrystalline substrate is used, defect-free and high-quality PZT singlecrystalline thin films can be formed.

In contrast, deposition of PZT thin films was carried out under the same condition by use of (001) silicon and (001) magnesium oxide as substrates. All of the PZT thin films obtained were of the polycrystalline type.

Next, PZT thin films were formed under the same condition by use of a silicon singlecrystalline substrate on which about 500 nm-thick strontium titanate was formed. The obtained epitaxial thin films were similar to those obtained in the case where the strontium titanate singlecrystalline substrate was used. From the results, it can be concluded that the entire substrate does not have to be made of the perovskite-type singlecrystal, but may be, for example, semiconductor or metal substrate on which perovskite-type singlecrystalline film is formed.

Examples of the present invention applied to specific devices will now be described.

EXAMPLE 1

Figure 4:
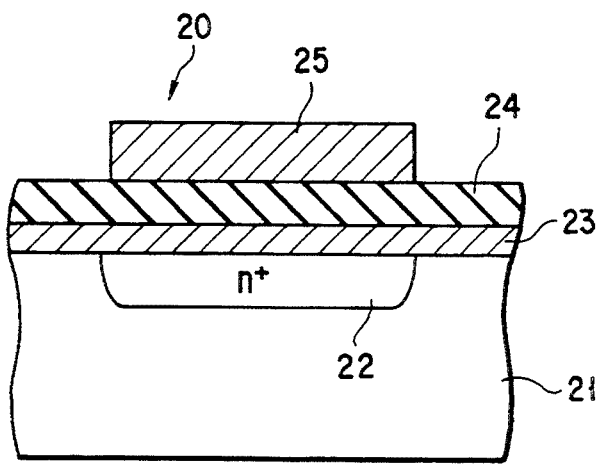
FIG. 4 is a diagram showing a cross section of a thin film capacitor according to an embodiment of the present invention.

FIG. 4 shows a cross section of a thin film capacitor according to this example. As can be seen in FIG. 4, a n-type layer 22 was formed on a p-type silicon single-crystalline substrate 21, and an impurity-containing strontium titanate thin film 23 of the perovskite-type was formed further thereon. The impurity employed was niobium, and the amount thereof was 0.3 in weight %. The impurity-containing strontium titanate thin film 23 served as the first electrode. A PZT thin film 24 was epitaxially deposited on the thin film 23 by the MOCVD method. The thickness of the PZT thin film was 0.05 μm, and the quality of the film was good. On the PZT thin film 24, there was provided the second electrode 25 made of platinum.

The capacitance of the thin film capacitor 20 was $1.2 \times 10^{-5}$ F/cm$^2$, and the relative dielectric constant of the PZT thin film 24, which was obtained from the capacitance value, was about 700.

As described, with a ferroelectric thin film on the niobium doped strontium titanate, the thickness of a capacitor can be made as thin as 0.1 μm or less. Thus, a large capacity can be obtained by a small area. More specifically, a sufficient capacity can be obtained even by a fine structure, enabling an easy improvement of integration.

Such a ferroelectric thin film capacitor and a transistor which is separately made on the substrate are combined into a DRAM or the like. Alternatively, a nonvolatile memory can be formed by utilizing a large remanence of the PZT singlecrystalline thin film.

EXAMPLE 2

FIG. 5 is a cross sectional view showing a brief structure of an ultrasonic—electric signal transducer of the present invention. The ultrasonic—electric signal transducer 30 has a structure in which the second electrode 33 is provided on the first electrode 31 made of strontium titanate singlecrystalline containing niobium as the impurity, via a PZT singlecrystalline thin film 32 formed by the epitaxial deposition. The thickness of the PZT singlecrystalline thin film 32 was 1 μm, and the quality of the film was good.

Usually, when an ultrasonic signal is applied to a transducer, the film thickness of the dielectric material varies, creating an electrical signal having a voltage corresponding to the waveform of the ultrasonic wave, between the first and second electrodes due to piezoelectric effect. Conversely, when an electrical signal having a high-frequency voltage is supplied between the first and second electrodes, the thickness of the PZT singlecrystalline thin film is varied in accordance with the electrical signal due to reverse piezoelectric effect, generating an ultrasonic wave.

The transducer 30 manufactured in this example has a structure in which a PZT singlecrystalline thin film 32 is formed by the epitaxial deposition on a strontium titanate singlecrystalline substrate 31. The thickness of the PZT singlecrystalline thin film 32 was 1 μm, and the quality thereof was much better than that of the conventional piezoelectric thin film. Consequently, there can be obtained transducers capable of handling ultrasonic waves of megahertz to gigahertz frequency range.

In the Examples 1 and 2, PZT was used as the ferroelectric material; however the ferroelectric device can be made of other materials such as barium titanate, and strontium titanate. The desired device can be prepared by selectively employing perovskite-type crystal substrates, and forming films thereon by the epitaxial deposition under the same condition.

EXAMPLE 3

FIG. 6 is a cross section of a thin film capacitor according to this example. As can be seen in FIG. 6, a thin film capacitor 40 has a structure in which a strontium titanate-made dielectric thin film 42 is formed on a strontium titanate-made first electrode 41 containing niobium and having a (001) orientation, and a platinum-made second electrode 43 is further provided. The dielectric thin film 42 was formed by the MOCVD method using the apparatus shown in FIG. 7.

A gate valve 508 of a quartz-made reactor 501 was opened, and a niobium-containing strontium titanate singlecrystalline substrate 41 was placed on a resistive heater 503 provided in the reactor. With the carrier gas side and the reactor side of a flow path switching valve 543 open, the air in the reactor 501 was replaced with the carrier gas. As the carrier gas, high-purity Ar was used, and the flow rate thereof was adjusted by a mass flow controller 525. The surface of the substrate was cleaned by chemical etching in advance. Then, a rotary pump 507 was driven so as to set the pressure in the reactor 501 at 10 Torr while monitoring a manometer 505.

In the meantime, the source materials of strontium and titanium were sealed in stainless steel-made source gas containers 511 and 512. The containers 511 and 512 were heated by source heating ovens 571 and 572, respectively, such that the gases in the containers are at 215° C., and 70° C., respectively.

Next, with the oxygen gas side of the flow path switching valve 543 open, a high-purity oxygen gas was introduced into the reactor 501 along with the carrier gas. The flow rate of the oxygen gas was adjusted by the mass flow controller 523. Further, the substrate 41 was heated up to 850° C. by the resistive heater 503 so as to clean the surface of the substrate.

During the cleaning, the following preliminary gas-flow steps were performed. With the exhaustion side of each of the flow path switching valves 541 and 542 open, and the reactor side of each closed, the carrier gas was supplied into the source gas containers 511 and 512. During the supply, the flow path switching valve 531 and 532 were opened, and the flow path switching valve 533 was closed. The flow rate of the carrier gas supplied to each of the source gas containers 511 and 512 was adjusted by the mass flow controllers 521 and 522 at rates of 400SCCM and 30SCCM, respectively. The pressures were detected by manometers 561 and 562. The source vapor obtained was sent downstream via a pipe while the pressure of the vapor being controlled by pressure adjusting valves 551 and 552. The flow rate of the carrier gas was fixed at constant by the mass flow controllers 524, 525, and 526.

After the temperature of the substrate, and the pressure in the reactor stabilized to 600° C. and 10 Torr, respectively, the reactor side of each of the flow path switching valves 541 and 542 was opened, and the exhaustion side of each was closed, so as to allow 20 minute of deposition of a strontium titanate thin film 42. During the deposition of the thin film, the temperature of the substrate 41, and the pressure in the reactor 501 were maintained both at constant by a thermocouple 504 and a pressure adjusting valve 506.

Thereafter, with the exhaustion side of each of the flow path switching valves 541 and 542, and the reactor side of each closed, the introduction of the source gas was stopped. Further, the heating of the substrate by the resistive heater 503 was stopped, and the substrate was cooled. During the cooling, the oxygen gas was let flow as it had been.

The source gases used here were bisdipivaloylmethanatestrontium ($Sr(C_{11}H_{19}O_2)_2$), and tetraisopropoxidetitanium ($Ti(i-OC_3H_7)_4$). Other than these, alkoxide compounds, alkyl compounds, β-diketone complex compounds, alkylamine compounds of strontium and titanium may be used. Examples of the source of oxygen are oxygen gas ($O_2$), dinitrogen monoxide ($N_2O$), dinitrogen dioxide ($N_2O_2$), nitrogen monoxide ($NO$), ozone ($O_3$), furan ($C_4H_4O$), and tetrahydrofuran ($C_4H_8O$). Other than Ar, $N_2$ or He may be used as the carrier gas.

Through the above steps, about 100 nm-thick strontium titanate singlecrystalline thin film 42 was formed on the niobium-containing strontium titanate singlecrystalline substrate 41.

The singlecrystalline thin film 42 was subjected to various analysis and observations.

According to the analysis by the inductively coupled plasma spectroscopy (ICP method), it was found that the ratio of Sr to Ti of the PZT single crystalline thin film 42 is 1. According to the observation of the surface of the PZT thin film by a differential interference microscope, it was found that the irregularity of the surface was as small as about 1 nm (very flat), and no defects due to lattice mismatching were observed.

According to the results of the X-ray diffraction analysis, it was found that only diffraction peaks from (00m) plane of $SrTiO_3$ and no other peak than strontium titanate was observed, indicating that c plane of the strontium titanate thin film 42 is parallel to c plane of niobium-containing strontium titanate singlecrystalline substrate 41, which is called "c-axis orientation".

Further, according to the electron beam diffraction measurement, it was found the directions of a- and b-axes of the strontium titanate thin film 42 are coincided with those of a-, and b-axes of niobium-containing strontium titanate singlecrystalline substrate 41, indicating that the strontium titanate is epitaxially deposited on the niobium-containing strontium titanate singlecrystalline substrate 41.

On the strontium titanate having the abovementioned characteristics, there was formed a platinum electrode 43 having an area of $3 \times 10^{-4}$ cm$^2$ as the second electrode, thereby obtaining a thin film capacitor 40 as shown in FIG. 7.

The capacitance of the thin film capacitor 40 was 550 pF, and the relative dielectric constant of the strontium titanate thin film 42, obtained from the capacitance value, was about 200.

In the above step, the deposition temperature was set at 600° C. With a deposition temperature within a range of 450°–800° C., thin film capacitors having characteristics close to those of the above can be obtained.

Further, strontium titanate thin films having thicknesses of 50 nm, 10 nm, and 5 nm were prepared by the above method, and accordingly, thin film capacitors were manufactured using these films. The capacitance of each of the capacitors was measured, and it was found that the capacitance of the thin film capacitor increased in inverse proportional to the thickness of the capacitor. More specifically, the capacitances of the capacitors having the film thicknesses of 50 nm, 10 nm, and 5 nm were 1 nF, 6 nF, and 11 nF, respectively. The relative dielectric constant was about 200 for the capacitors of any thickness. Thus, it was confirmed that the characteristics of the strontium titanate thin film do not deteriorate even if the thickness of the strontium titanate thin film was made as thin as 5 nm.

An strontium titanate thin film was deposited on (110) plane and (111) plane of niobium-containing strontium titanate singlecrystalline substrates. In both cases, a strontium titanate thin film was formed by epitaxial deposition on a niobium-containing strontium titanate singlecrystalline substrate. The obtained thin films were subjected to X-ray diffraction analysis, and the results of the analysis indicated that thin films formed on (110) plane and (111) plane exhibited the deposition on (110) plane and (111) plane, respectively, of strontium titanate. It was confirmed that with the obtained thin films, there can be obtained a thin film capacitor having characteristics equivalent to those of the case where a strontium titanate thin film was formed on (001) plane.

As described, in this example, a niobium-containing strontium titanate singlecrystalline substrate was used as a lower electrode. Note that it is possible to form a strontium titanate thin film on such an electrode, both of which are of a similar dielectric material.

No reaction product or the like are formed between the niobium-containing strontium titanate singlecrystalline substrate 41 and the strontium titanate thin film 42. Accordingly, a sharp interface can be obtained between the substrate 41 and the thin film 42, and therefore a high-quality strontium titanate thin film 42 can be obtained. Further, the characteristics of a portion of the strontium titanate which is located close to the interface do not deteriorate. As a conclusion, with a niobium-containing strontium titanate singlecrystalline substrate, there can be achieved a thin film capacitor having a high dielectric property and good characteristics.

EXAMPLE 4

Figure 8:
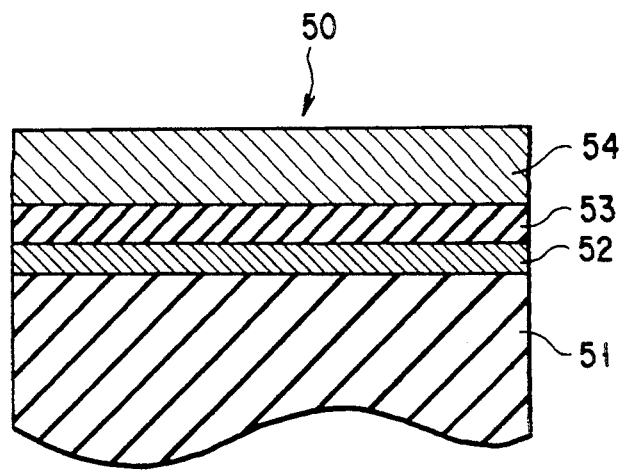
FIG. 8 is a diagram showing a device cross section of a thin film capacitor according to another embodiment of the present invention.

FIG. 8 is a cross section of a thin film capacitor according to this example. As can be seen in FIG. 8, a thin film capacitor has a structure in which a strontium titanate singlecrystalline thin film 52 to which 0.8 weight % of niobium was added was formed on an strontium titanate substrate 51. The niobium-containing strontium titanate thin film was formed by the MOCVD method using pentaethoxide niobium ($Nb(OC_2H_5)_5$) as the source of niobium, along with the source compounds for strontium and titanium. The specific resistance of the thin film was 5 mΩ·cm, and had a performance good enough to be used as a lower electrode of a thin film capacitor. Further, on the thin film 52, formed are a strontium titanate thin film 53 serving as a dielectric film, and a platinum electrode 54 serving as the second electrode.

The capacitance of the thin film capacitor 50 was 11 nF, and the relative dielectric constant of the strontium titanate thin film, obtained from the capacitance value, was about 200.

Further, with various types of strontium titanate substrates each containing niobium as an impurity, thin films can be prepared by a method similar to the above to obtain capacitors. The following are examples thereof.

(1) Strontium titanate to which niobium was added by ion implantation was subjected to a heat treatment in an oxygen atmosphere, to prepare a substrate. More specifically, a strontium titanate substrate including a layer having a specific resistance of 10 mΩ·cm was obtained by conducting the heat treatment at 800° C. in the oxygen atmosphere. On the substrate thus obtained, formed are a strontium titanate thin film and a platinum electrode by a method similar to those of the above-described examples.

(2) Niobium is doped by thermal diffusion method in a strontium titanate to prepare a substrate. Niobium diffused in the strontium titanate renders the surface region of the substrate to have a conductivity. The substrate this obtained included a layer having a specific resistance of about 10 mΩ·cm. On the substrate thus obtained, formed are a strontium titanate thin film and a platinum electrode by a method similar to those of the above-described examples.

The capacitances of the thin film capacitors prepared in the above-mentioned manners (1) and (2) were 11 nF and it was confirmed that these capacitors had similar performances to those of the above-described examples. Therefore, it can be concluded that a dielectric material including a conductive layer containing an impurity at least in its surface region can be used as the first electrode.

EXAMPLE 5

In this example, a thin film capacitor having a dielectric thin film of the present invention, and a transistor were combined with each other to prepare a memory cell of a DRAM, and the characteristics thereof were examined.

Figure 9:
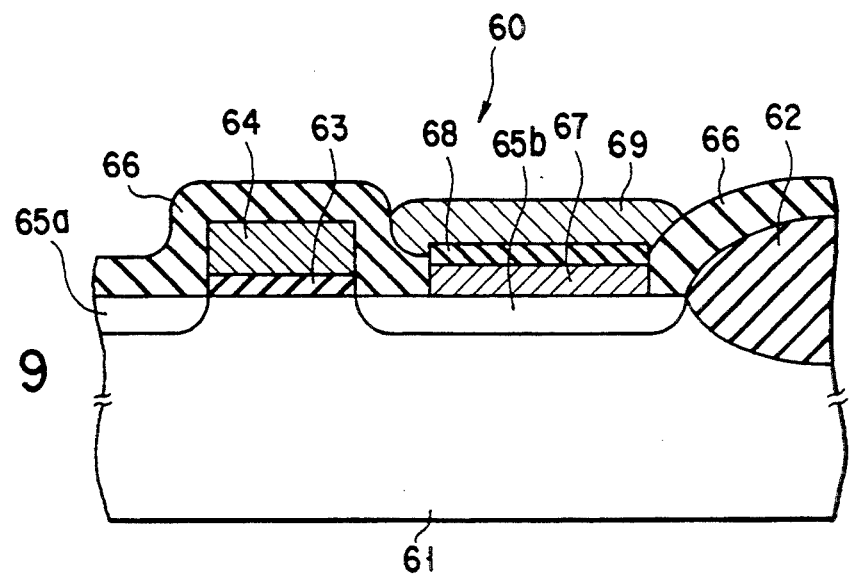
FIG. 9 is a diagram showing a cross section of a memory cell of a DRAM including a device of the present invention.

FIG. 9 shows a cross section of a DRAM of this example.

A method of preparing the DRAM will now be explained following the steps.

An isolation oxide film 62 is formed on a p-type silicon substrate 61 of (100) face. A gate-oxide film 63, and a gate electrode 64 made of polycrystalline silicon were formed in an element formation region isolated by the oxide film 62. Then, by use of the gate oxide film 63 and the gate electrode 64 as a mask, ions were implanted into the surface region of the silicon substrate 61 so as to form a source region 65a and a drain region 65b in a self-alined manner.

Next, an oxide film 66 was deposited on the entire surface of the substrate on which the isolation oxide film 62 and the gate electrode 64 were formed. Then, the portion of the oxide film 66 corresponding to the drain region 65b was etched to open a contact hole, in which a niobium-containing strontium titanate film 67, and an strontium titanate dielectric film 68 were formed in the mentioned order. The niobium-containing strontium titanate film 67 and the strontium titanate dielectric film 68 served respectively as a lower electrode and a dielectric film of the capacitor.

It should be noted that the niobium-containing strontium titanate film 67 and the strontium titanate dielectric film 68 were formed by the MOCVD method as in the case of Example 2, and the thicknesses of the films were set to 100 nm and 10 nm, respectively. Further, the amount of niobium contained in the niobium-containing strontium titanate film 67 was set at 1 weight %.

Lastly, a polycrystalline silicon film 69, which is supposed to serve as an upper electrode of the capacitor, was deposited on the entire surface, and the polycrystalline silicon film 69 was patterned into an upper electrode shape by photolithography, thereby obtaining a memory cell of a DRAM.

As described above, the capacitor of the memory cell 60 of this example includes the niobium-containing strontium titanate film 67 serving as the lower electrode, the strontium titanate dielectric film 68 epitaxially deposited as a dielectric film on the niobium-containing strontium titanate film 67, and the polycrystalline silicon film 69 serving as the upper electrode.

The lower electrode and the dielectric film, in other words, the niobium-containing strontium titanate film 67 and the strontium titanate dielectric film 68, are basically the same material and the only difference therebetween is whether or not niobium was added. Consequently, the niobium-containing strontium titanate film 67 and the strontium titanate dielectric film 68 do not react with each other, thereby obtaining a sharp interface therebetween. Therefore, the leak current is very small, achieving a capacitor having a high relative dielectric constant. According to the actual measurement, the relative dielectric constant was about 200, which was found to be extremely higher than those of silicon oxide (relative dielectric constant: 4) and tantalum oxide (relative dielectric constant: 20).

Further, with the above-described method, a memory cell of the strontium titanate dielectric film 68 having a thickness of 5 nm was formed. The capacitance thereof was measured to be 10 nF. Thus, it was found that as the thickness of the strontium titanate dielectric film 68 is decreased, the capacitance is increased in accordance with the decrease.

As described, in this example, a capacitor formed of a thin and high-quality dielectric film having a high relative dielectric constant can be obtained. Therefore, as compared to the conventional DRAM having a capacitor in which dielectric films such as silicon oxide ($SiO_2$) and silicon nitride ($Si_3N_4$) are formed on a metal lower electrode, the DRAM of the present invention can easily achieve a high integration and a large capacitance.

EXAMPLE 6

Figure 10:
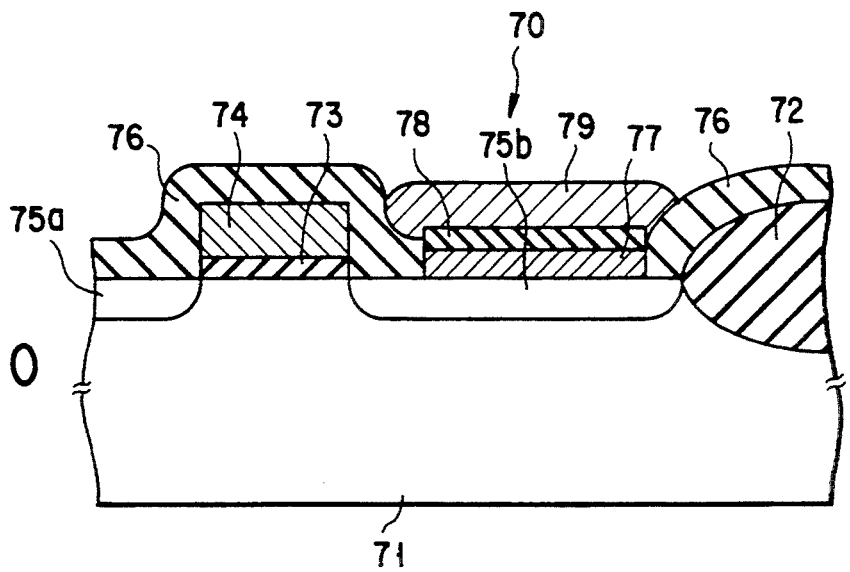
FIG. 10 is a diagram showing a cross section of a memory cell of a nonvolatile memory device including a device of the present invention.

FIG. 10 shows a cross section of a memory cell of a non-volatile memory device including a thin film capacitor according to the present invention. In this example, PZT was used for the dielectric film of the thin film capacitor.

A method of forming the memory cell will now be described following the steps.

In a similar manner to the example 5, an isolation oxide film 72, a gate oxide film 73, and a gate electrode 74 are formed on a p-type silicon substrate 71 of (001) plane. By using the gate oxide film 73 and the gate electrode 74 as a mask, the surface region of the silicon substrate 71 was impregnated with ions, so as to form a source region 75a and a drain region 75b in a self-alined manner.

After that, an oxide film 76 is formed on the entire surface of the substrate, and the region of the oxide film 76 corresponding to the drain region 75b was removed by etching to open a contact hole. In the contact hole, a strontium titanate film 77 to which 1 weight % of niobium was added was formed as a lower electrode of the capacitor. The film was formed by the MOCVD method, and the thickness thereof was 100 nm.

Next, a PZT ferroelectric film 78, which served as a dielectric film of the capacitor, was formed on the niobium-containing strontium titanate film 77. The formation of the film was carried out by the MOCVD method. The thickness of the PZT ferroelectric film 78 obtained was 100 nm, and the ratio of Zr to (Zr+Ti) of the PZT was 0.5.

Lastly, a polycrystalline silicon film 79 serving as an upper electrode was deposited on the entire surface, and the film was patterned by photolithography, thereby obtaining a memory cell 70.

The memory cell 70 of the capacitor thus obtained includes the niobium-containing strontium titanate film 77 serving as a lower electrode, the PZT ferroelectric films 78 formed as a dielectric film on the niobium-containing strontium titanate film 77, and the polycrystalline silicon film 79.

As described in Example 1, PZT can be formed on a perovskite-type singlecrystalline substrate by epitaxial deposition. Therefore, the PZT ferroelectric film 78 obtained in this example is a high-quality singlecrystalline thin film. Consequently, even if the PZT ferroelectric film 78 is made thin, the leak current can be controlled to a low level, and a capacitor having a large relative dielectric constant can be obtained.

The PZT used here as a dielectric film is a ferroelectric material, and exhibits the polarization-electrical field hysteresis characteristic. For example, the remanence is about 40 $\mu C/cm^2$, and the coercive field is about 50 kv/cm. Thus, the memory cell of this example can store a charge, which corresponds to a signal, in a nonvolatile manner. In the case of the PZT ferroelectric film 78, even if the thickness was reduced to 10 nm, a nonvolatile signal storing operation could be performed as in the case where the thickness is 100 nm. Further, after $10^{15}$ times of repetition of the writing/reading of a signal, the signal storage characteristic did not deteriorate unlike the case of the conventional nonvolatile memory device in which a ferroelectric film was formed on a platinum electrode or the like.

In this example, the PZT having a ratio (Zr/(Ti+Zr)) of 0.5 was used as the material for the ferroelectric film. It was further confirmed that similar effects could be obtained by use of PZT having the ratio of 0–0.95, a lithium niobate material, a potassium niobate material, or a lithium fantalate.

EXAMPLE 7

Figure 11:
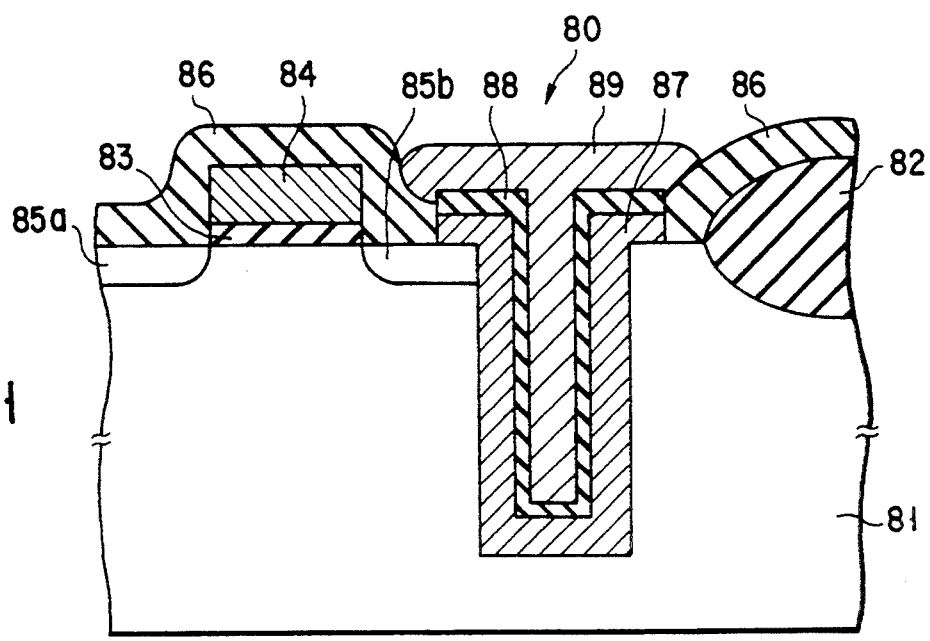
FIG. 11 is a diagram showing a cross section of a memory cell of a DRAM including a device of the present invention.

FIG. 11 shows a cross section of a memory cell of a DRAM having a thin film capacitor according to the present invention.

In a memory cell 80 of this example, the capacitor has a trench structure.

A method of forming a memory cell will be described following the steps.

In a similar manner to the above example, a gate oxide film 83, a gate electrode 84, a source region 85a, a drain region 85b, and an oxide film 86 were formed on a silicon substrate 81 on which an isolation oxide film 82 was formed. Then, the oxide film 86 of the drain region 85b and the silicon substrate 81 were etched to form a groove. The inner walls of this groove were coated with a niobium-containing strontium titanate film 87, and an strontium titanate dielectric film 88 in the mentioned order, and the groove was filled with a polycrystalline silicon film 89. The niobium-containing strontium titanate film 87, the strontium titanate dielectric film 88, and the polycrystalline silicon film 89 served as a lower electrode, a dielectric film, and an upper electrode, respectively. Thus, a memory cell 80 was obtained.

The strontium titanate dielectric film 88 was formed in a manner similar to those of the above examples by the MOCVD method. Not only a strontium titanate dielectric film 88 could be formed on the surface of the niobium-containing strontium titanate film 87 by epitaxial deposition, but also the niobium-containing strontium titanate film 87 and the strontium titanate dielectric film 88 each having a good coating performance could be obtained even for a complicated shape such as of a trench structure.

Since the capacitor of the memory cell thus obtained had the trench structure, a large efficient area, and a capacitance as larger as 50 fF were achieved.

Memory cells having trench structures are also manufactured by the conventional technique by use of a silicon oxide and a silicon nitride as dielectric films of the capacitor of each cell; however the capacitance of such a capacitor is about 1 fF. As compared to this value, the memory cell of this example has a capacitance about 50 times as large as the conventional cell. Thus, it was concluded that with a capacitor having a trench structure, the area of the capacitor could be further made small, and a DRAM having a degree of integration higher than those of the above examples could be achieved.

EXAMPLE 8

Figure 12:
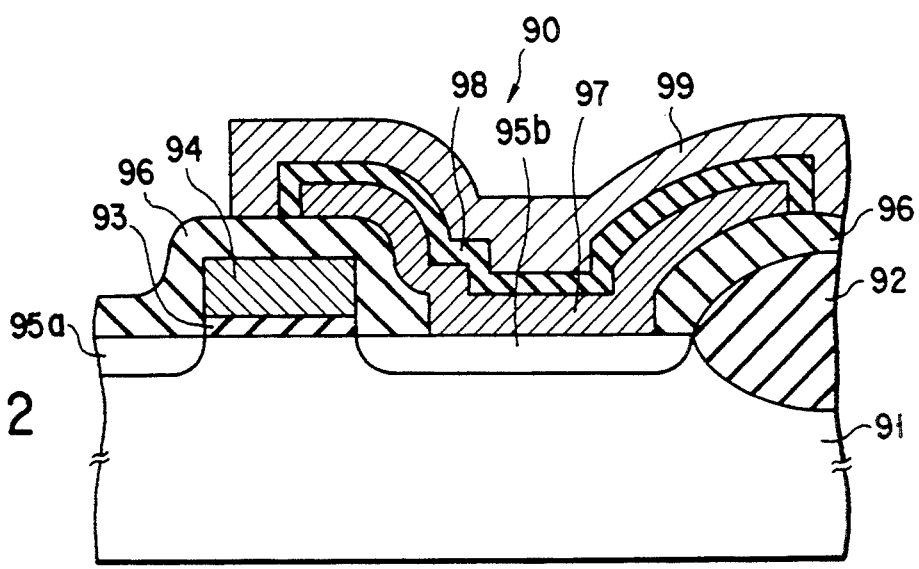
FIG. 12 is a diagram showing a cross section of a memory cell of a DRAM including a device of the present invention.

FIG. 12 shows a cross section of a memory cell of a DRAM having a thin film capacitor according to the present invention.

In this memory cell 90, the capacitor had a stack structure.

A method of preparing a memory cell will now be described following the steps.

In a similar manner to the above example, a gate oxide film 93, a gate electrode 94, a source region 95a, a drain region 95b, and an oxide film 96 were formed on a silicon substrate 91 on which an isolation oxide film 92 was formed. Then, the oxide film 96 of the drain region 95b was etched to open a contact hole.

A niobium-containing strontium titanate film 97 serving as a lower electrode, was deposited on the entire surface, and this niobium-containing strontium titanate film 97 was patterned into a lower electrode stacking on the oxide films 92 and 96.

As in the above examples, with the MOCVD method, a strontium titanate dielectric film 98 was formed on the niobium-containing strontium titanate film 97 by the epitaxial deposition, and then patterned into a desired shape.

Lastly, a polycrystalline silicon film 99, which would be formed into an upper electrode, was deposited on the entire surface, and then patterned into the upper electrode shape, thereby obtaining a memory cell 90.

The capacitance of the memory cell 90 obtained was 50 fF. It found that the memory cell 90 obtained had a capacitance about 50 times as large as that of the conventional memory cell having a stack structure in which silicon oxide or silicon nitride was used.

Further, memory cells having trench and stack structures were prepared using PZT thin films, which are ferroelectric films, in place of the strontium titanate dielectric films 88 and 98 of the memory cells shown in FIGS. 11 and 12. It was confirmed that the memory cells could hold a signal charge in a nonvolatile manner as in this example.

By employing a trench or stack structure, the efficient capacitor area can be increased, and the capacitor area of obtaining a necessary charge for holding a signal can be decreased. Therefore, the degree of integration can be made higher than the case of the thin film capacitor having a flat surface structure shown in FIG. 10.

In each of the memory cells shown in Examples 5-8, polycrystalline silicon was used as the material for the upper electrode, but silicide or metals can be also used. Further, as the dielectric material, other dielectric materials each having a high dielectric constant, such as barium titanate and barium-strontium titanate, can be also used.

EXAMPLE 9

Figure 13:
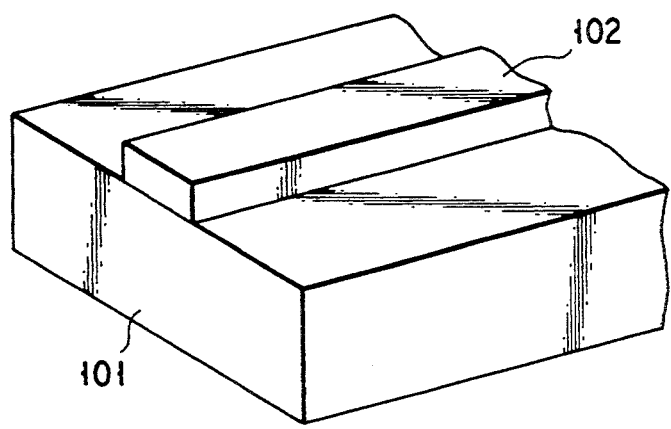
FIG. 13 is a diagram showing an optical device having a waveguide according to another embodiment of the present invention.

FIG. 13 shows a device having a waveguide according to this example. As shown in FIG. 13, a PZT singlecrystalline thin film 102 was formed on a strontium titanate singlecrystalline substrate 101 by epitaxial deposition. The PZT singlecrystalline thin film 102 was formed by the MOCVD method using the apparatus described in Example 1.

The thickness of the singlecrystalline thin film 102 obtained was about 1 μm, and the quality of the film was good. Thus, it was concluded that a high-quality thin film could be obtained by use of a perovskite-type singlecrystalline substrate similar to PZT.

With the PZT singlecrystalline thin film obtained, the characteristics of the waveguide such as light loss can be improved.

As described, according to the first aspect of the present invention, a dielectric material containing a conductive material is used as the first electrode, and the second dielectric thin film is formed thereon. The first electrode and the dielectric thin film are less likely to react with each other than an electrode made of a metal and a dielectric thin film. Consequently, a thin film containing less defects and having a sharp interface can be prepared. Further, the first electrode does not easily react with the thin film, and therefore the deterioration of the portion of the dielectric thin film located close to the electrode can be prevented.

Particularly, in the case where a compound having the perovskite-type crystal structure is used as the first and second dielectric material, the second dielectric material can be formed by epitaxial deposition; therefore a high-quality thin film containing less defects can be formed. Accordingly, a device having a structure in which the second electrode is provided on the dielectric thin film can achieve a large capacitance, and a high degree of integration.

According to the second aspect of the present invention, an oxide ferroelectric thin film is formed by epitaxial deposition on a substrate having a perovskite-type crystal structure. Consequently, there can be provided a high-quality thin film made of, for example, PZT, or barium titanate, and a high-performance thin film device such as a waveguide having good characteristics can be achieved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device, comprising:
   a first electrode made of a first dielectric material containing an impurity;
   a dielectric thin film made of a second dielectric material provided on a surface of the first electrode;
   a second electrode provided on a surface of the dielectric thin film; and
   wherein, the first electrode is formed on a semiconductor substrate.

2. A device according to claim 1, wherein the first dielectric material is an oxide.

3. A device according to claim 1, wherein the first dielectric material is a fluoride.

4. A device according to claim 1, wherein the second dielectric material is a compound which is represented by a formula $ABO_3$ (wherein A is at least one metal selected from the group consisting of Pb, Ca, Sr, Ba, and La, B is at least one metal selected from the group Ti and Zr).

5. A device according to claim 1, wherein the impurity is niobium.

6. A device according to claim 1, wherein an amount of the impurity contained is 5 weight % or less.

7. The device of claim 1, further comprising:
   a semiconductor memory formed on the semiconductor substrate;
   a transistor formed on the semiconductor substrate; and
   wherein, the first electrode, the dielectric thin film and the second electrode form a device having a dielectric thin film connected to the transistor.

8. A device according to claim 7, wherein the first dielectric material is an oxide.

9. A device according to claim 7, wherein the first dielectric material is a fluoride.

10. A device according to claim 7, wherein the second dielectric material is a compound which is represented by a formula $ABO_3$ (wherein A is at least one metal selected from the group consisting of Pb, Ca, Sr, Ba, and La, B is at least one metal selected from the group Ti and Zr).

11. A device according to claim 7, wherein the impurity is niobium.

12. A device according to claim 7, wherein an amount of the impurity contained is 5 weight % or less.

13. A semiconductor device, comprising:
    a first electrode made of a first dielectric material containing an impurity and having a perovskite-type crystal structure;
    a dielectric thin film made of a second dielectric material, formed by epitaxial deposition on a surface of the first electrode; and
    a second electrode provided on a surface of the dielectric thin film.

14. A device according to claim 13, wherein the first dielectric material is an oxide.

15. A device according to claim 13, wherein the first dielectric material is a fluoride.

16. A device according to claim 13, wherein the second dielectric material is a compound which is represented by a formula $ABO_3$ (wherein A is at least one metal selected from the group consisting of Pb, Ca, Sr, Ba, and La, B is at least one metal selected from the group Ti and Zr).

17. A device according to claim 13, wherein the impurity is niobium.

18. A device according to claim 13, wherein an amount of the impurity contained is 5 weight % or less.

19. A device according to claim 13, wherein the first electrode is formed on a semiconductor substrate.

20. The device of claim 19, further comprising:
    a semiconductor memory formed on the semiconductor substrate;
    a transistor formed on the semiconductor substrate; and
    wherein, the first electrode, the dielectric thin film and the second electrode form a device having a dielectric thin film connected to the transistor.

* * * * *